(12) United States Patent
Sato et al.

(10) Patent No.: US 9,167,435 B2
(45) Date of Patent: Oct. 20, 2015

(54) APPARATUS FOR SUPPORTING LAYOUT OF WIRELESS BASE STATIONS IN BUILDING

(75) Inventors: Yoshihito Sato, Hitachi (JP); Tsutomu Yamada, Hitachinaka (JP)

(73) Assignee: HITACHI, LTD., Tokyo (JP)

(*) Notice: Subject to any disclaimer, the term of this patent is extended or adjusted under 35 U.S.C. 154(b) by 141 days.

(21) Appl. No.: 13/813,981

(22) PCT Filed: Jul. 11, 2012

(86) PCT No.: PCT/JP2012/067638
§ 371 (c)(1),
(2), (4) Date: Feb. 4, 2013

(87) PCT Pub. No.: WO2013/073230
PCT Pub. Date: May 23, 2013

(65) Prior Publication Data
US 2013/0194276 A1 Aug. 1, 2013

(30) Foreign Application Priority Data

Nov. 18, 2011 (JP) .................................. 2011-252416

(51) Int. Cl.
*G06T 17/00* (2006.01)
*H04W 40/00* (2009.01)
*H04W 16/18* (2009.01)
*G06F 17/50* (2006.01)
*H04W 16/20* (2009.01)
*H04W 4/04* (2009.01)

(52) U.S. Cl.
CPC ............. *H04W 16/18* (2013.01); *G06F 17/509* (2013.01); *H04W 4/043* (2013.01); *H04W 16/20* (2013.01)

(58) Field of Classification Search
None
See application file for complete search history.

(56) References Cited

U.S. PATENT DOCUMENTS

2002/0002046 A1* 1/2002 Okanoue et al. ............... 455/423
2004/0259554 A1* 12/2004 Rappaport et al. ............ 455/446

FOREIGN PATENT DOCUMENTS

JP 2009-296572 12/2009

* cited by examiner

*Primary Examiner* — Yingchun He
(74) *Attorney, Agent, or Firm* — Baker Botts L.L.P.

(57) ABSTRACT

In the construction of a wireless network in a building, structure conditions such as the floor plan of the building and the shape of the floor, material conditions such as materials for structures, and the like have a great effect on radio wave propagation characteristics. This causes a problem that unless these pieces of information are taken into consideration, an accurate layout design of wireless base stations cannot be made. In the construction of a new wireless network in a building, a wireless network similar to structure conditions of a newly constructed building is extracted from structure conditions of past buildings in which a wireless network is constructed. The layout positions of wireless base stations used in the extracted wireless network are regarded as the layout positions of wireless base stations in the new wireless network.

6 Claims, 10 Drawing Sheets

| STRUCTURE | | (3) COORDINATES | | | (4) SHAPE | (5) PERMITTIVITY/ PERMEABILITY/ CONDUCTIVITY |
|---|---|---|---|---|---|---|
| (1) CATEGORY | (2) NAME | | x | y | z | | |
| WALL | W1 | STARTING POINT | 0 | 0 | 0 | CUBE | |
| | | END POINT | 16 | 0.5 | 3 | | |
| WALL | W2 | STARTING POINT | 15.5 | 0 | 0 | CUBE | |
| | | END POINT | 16 | 9.5 | 3 | | |
| ⋮ | | | | | | | |
| PILLAR | P1 | STARTING POINT | 0 | 0 | 0 | CUBE | |
| | | END POINT | 1 | 1 | 3 | | |
| PILLAR | P2 | STARTING POINT | 3 | 0 | 0 | CUBE | |
| | | END POINT | 4 | 1 | 3 | | |
| ⋮ | | | | | | | |
| EQUIPMENT | M | | | | | CUBE | |

FIG. 4

| BASE STATION ANTENNA | | | (4) COORDINATES | | | ANGLE | |
|---|---|---|---|---|---|---|---|
| (1) TYPE | (2) NAME | (3) TRANSMISSION POWER | x | y | z | (5) TILT | (6) AZIMUTH |
| DIPOLE | AP1 | 13 | 10 | 15 | 2.7 | 0 | 0 |
| PLANAR | AP2 | 13 | 1 | 3 | 2.7 | 0 | 90 |
| ⋮ | | | | | | | |

FIG. 5

| RECEIVING ANTENNA | (2) COORDINATES | | | (3) RECEIVING POWER | |
|---|---|---|---|---|---|
| (1) NAME | x | y | z | AP1 | AP2 |
| ST1 | 1 | 1 | 1 | -100 | -50 |
| ST2 | 2 | 1 | 1 | -98 | -45 |
| ST3 | 3 | 1 | 1 | -89 | -43 |
| ST4 | 4 | 1 | 1 | -95 | -62 |
| ⋮ | | | | | |

| NODE | (1)STARTING POINT | | | (2)SIZE | | | (3) FURNITURE, ETC. | (4) WEIGHT |
|---|---|---|---|---|---|---|---|---|
| NAME | x | y | z | Wx | Wy | Wz | | |
| 210 | 0 | 15 | 0 | 30 | 10 | 10 | 0 | 3000 |
| 211 | 25 | 10 | 0 | 5 | 5 | 3 | 10 | 65 |
| 212 | 20 | 5 | 0 | 5 | 10 | 3 | 15 | 135 |
| 213 | 15 | 0 | 0 | 5 | 5 | 3 | 10 | 215 |
| ⋮ | | | | | | | | |
| | | | | | | | | |
| | | | | | | | | |
| | | | | | | | | |
| | | | | | | | | |

| (1) EDGE NAME | (2) NODE | | (3) BOUNDARY SURFACE DIRECTION OF STARTING POINT | (4) BLOCKING CATEGORY | (5) STRUCTURE | (6) WEIGHT |
|---|---|---|---|---|---|---|
| | STARTING POINT | END POINT | | | | |
| 220 | 212 | 210 | UPWARD | BLOCKING | WALL | 10 |
| 221 | 212 | 210 | | BLOCKING | PILLAR | 50 |
| 222 | 212 | 211 | RIGHTWARD | BLOCKING | PARTITION | 20 |
| 223 | 212 | 214 | | BLOCKING | PARTITION | 20 |
| 224 | 212 | 215 | | BLOCKING | PARTITION | 20 |
| 225 | 212 | 216 | DOWNWARD | BLOCKING | PARTITION | 20 |
| 226 | 212 | 217 | | OPENING | — | 0 |
| 227 | 212 | 213 | LEFTWARD | OPENING | — | 0 |
| 228 | 212 | 213 | | BLOCKING | PILLAR | 50 |
| 229 | 212 | 213 | | OPENING | — | 0 |

APPARATUS FOR SUPPORTING LAYOUT OF WIRELESS BASE STATIONS IN BUILDING

TECHNICAL FIELD

The present invention relates to an apparatus for supporting the layout of wireless base stations in a building. More specifically, the invention relates to an apparatus for supporting the layout design of wireless base stations for use in a wireless network system in a building.

BACKGROUND ART

The multi-hop wireless network communication technology is a technology by which a wireless station exchanges data with the desired wireless station via multiple wireless stations installed as relay stations between the wireless stations by multi-hop communication.

In multi-hop communication, a wireless station does not directly wirelessly communicate with the desired window station but wirelessly communicates therewith via relay stations. Accordingly, multi-hop communication is a communication technology that is effective, for example, when an obstacle to radio waves is present.

Particularly in recent years, the cost of wireless communication devices for wireless LAN (local area network) or the like has been reduced, and sensor network technologies such as Bluetooth®, which is a short-range wireless communication standard mainly for digital devices, and ZigBee, which is a short-range wireless communication standard mainly for household electrical appliances, have been standardized. Accordingly, expectation for application of wireless technologies to the industry field has been increased, increasing application cases.

The multi-hop wireless network technology is expected to contribute to reductions in the number of monitoring/control cables by applying it to the industry field, for example, social infrastructure business, such as electric power or transportation, and monitoring/control networks for the manufacturing industry, such as factory automation (FA) systems and process automation (PA) systems.

Further, making wired cables wireless can result in reductions in the cost of cable installation or maintenance cost for a routine check.

Furthermore, use of wireless technologies allows business entities to more flexibly deal with changes in operation, such as addition of equipment or a change in the configuration of equipment.

As seen, wireless network systems have many advantages. On the other hand, application of wireless real-time communication to the industry field requires high reliability, and a failure that occurs in a wireless network must be dealt with rapidly.

For example, assume that a wireless network that meets a requirement by obtaining multiple channels, for example, two communication paths by multi-hop communication is constructed. In this case, at the point in time when one communication path fails, the reliability of the other communication path will decrease. For this reason, in the construction of a communication path, it is necessary to design favorable communication paths that are insusceptible to a failure to the extent possible.

In the field of industry, it is particularly important to construct or design communication paths of a wireless network in a building.

A wireless environment in a building is significantly susceptible to the floor plan of the building, the height of the ceiling, material characteristics of the wall, ceiling, and floor, the size of an opening such as the door or window, furniture or equipment inside the building, and the like. The wireless environment also shows characteristics that are different among sites over which a wireless network is to be constructed. Accordingly, a wireless network must be constructed or designed considering these factors.

For this reason, it is desired to actually measure the propagation state of a radio wave at locations where a wireless base station can be installed, of the sites over which a wireless network is to be constructed and to design the layout of wireless base stations on the basis of the measurement results.

However, it is difficult to actually measure the propagation state of a radio wave in all parts of space in the building in terms of cost and time. For this reason, it is practical and effective to design the layout of wireless base stations in a building into which wireless base stations are to be introduced newly, on the basis of the layout design of wireless base stations in a building in which a wireless network is already constructed, instead of measuring the propagation state of a radio wave thoroughly as described above.

The present invention relates to a technology of constructing a wireless network in a new building using an already constructed wireless network as described above.

Methods for estimating the propagation of a radio wave include a method of using a statistical model based on values which are actually measured at various locations. In addition, Japanese Unexamined Patent Application Publication No. 2009-296572 (Patent Literature 1) and the like have proposed methods for estimating radio wave propagation characteristics. These technologies are configured to, in the installation of wireless base stations into a wide area, estimate the installment locations of wireless base stations using existing radio wave propagation characteristics.

In a building, however, there are large differences in structure among sites. Accordingly, to construct a wireless network system which is required to have high reliability, it is important to design a wireless network considering a propagation environment specific to each site.

CITATION LIST

Patent Literature

Patent Literature 1: Japanese Unexamined Patent Application Publication No. 2009-296572

SUMMARY OF INVENTION

Technical Problem

A radio wave propagation characteristic estimation support system disclosed in the above-mentioned Patent Literature 1 stores attribute information of an area and reference information which is useful in estimating radio wave propagation characteristics of this area in such a manner that the attribute information and the reference information are associated with each other. An attribute information input unit of the system receives attribute information of an area whose radio wave propagation characteristics are desired to estimate.

An output unit thereof searches information stored in a storage unit, identifies an area having attributes matching the attribute information received by the attribute information input unit, and outputs reference information associated with the identified area.

As seen, the technology described in Patent Literature 1 is a large wireless communication system for performing mobile communications in an extremely wide area and is a method for estimating radio wave propagation characteristics related to open, large space.

However, space through which radio waves propagate in a building is not open, large space in a wide area described above but narrow, closed space. Further, there are many accessory structure conditions. Accordingly, there is a limit to the above-mentioned technology, and the technology is not applicable in practice.

The accessory structure conditions include structure conditions, such as the floor plan of the building and the shapes of the wall and floor, and material conditions, such as the materials for the accessory structures. These accessory structure conditions have a great effect on radio wave propagation characteristics. Accordingly, there is a problem that unless these pieces of information are taken into consideration, an accurate layout design of wireless base stations cannot not be made.

An object of the present invention is to provide an apparatus for supporting the layout of wireless base stations in order to construct a reliable wireless network in newly constructing a wireless network in a building.

Solution to Problem

The present invention is characterized in that an apparatus for supporting layout of wireless base stations in a building includes: storage means configured to store at least a floor plan of a existing building, an attribute of a structure of the existing building, a layout position of a wireless base station in the existing building, or the like; graph generation means configured to, based on a floor plan of a new building or an attribute of a structure of the new building, define part of space included in the new building as a node and define, as an edge (link), a propagation path which is located between the node and another node adjacent to the node and through which a radio wave propagates, and to generate a graph by adding information indicating a link between the node and the edge (link); graph detection means configured to evaluate correlation between a subgraph serving as part of a graph related to the new building generated by the graph generation means and a subgraph serving as part of a graph related to the existing building, the graph related to the existing building being generated by the graph generation means and stored in the storage means, and to extract an existing subgraph having a high degree of correlation; and display means configured to display the floor plan of the new building as well as to extract the layout position of the wireless base station from the subgraph of the existing building extracted by the graph detection means and display the layout position.

As used herein, a new building refers to a building in which a wireless network is to be newly constructed. Even if a building is an existing building, the building means a new building as long as a wireless network is to be newly constructed in the building.

Advantageous Effects of Invention

According to the present invention, in the construction of a new wireless network in a building, it is possible to extract a wireless network similar to structure conditions of the building, in which a wireless network is to be newly constructed, from structure conditions of past buildings in which a wireless network is constructed and to use layout information of wireless base stations used in the extracted past wireless network as the layout of wireless base stations in a new wireless network. Thus, a reliable wireless network can be constructed.

DESCRIPTION OF EMBODIMENTS

First Embodiment

Figure 1:
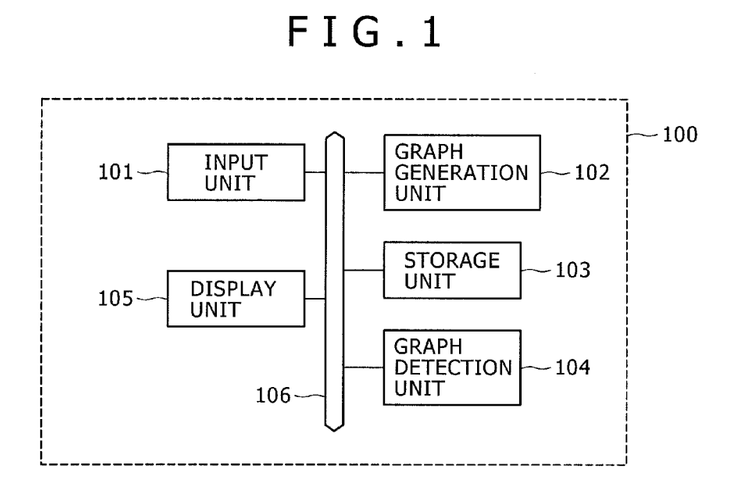
FIG. 1 is a diagram showing a configuration of an apparatus for supporting layout of wireless base stations according to an embodiment of the present invention.

Hereafter, an embodiment of the present invention will be described in detail with reference to the drawings. FIG. 1 is a diagram showing an example configuration of a wireless environment detection apparatus 100 according to a first embodiment of the present invention.

The wireless environment detection apparatus 100 includes an input unit 101, a graph generation unit 102, a storage unit 103, a graph detection unit 104, and a display unit 105. These components are coupled together via a signal line 106 so as to exchange signals with one another.

The input unit 101 receives various inputs such as an input of three-dimensional structures in a new building in which a wireless network is to be constructed, an input of three-dimensional structures in a building in which a wireless network is already installed and whose wireless propagation environment is known, and inputs of antenna installation of radio base stations and transmission power distribution of radio waves from the radio base stations.

Figure 2:
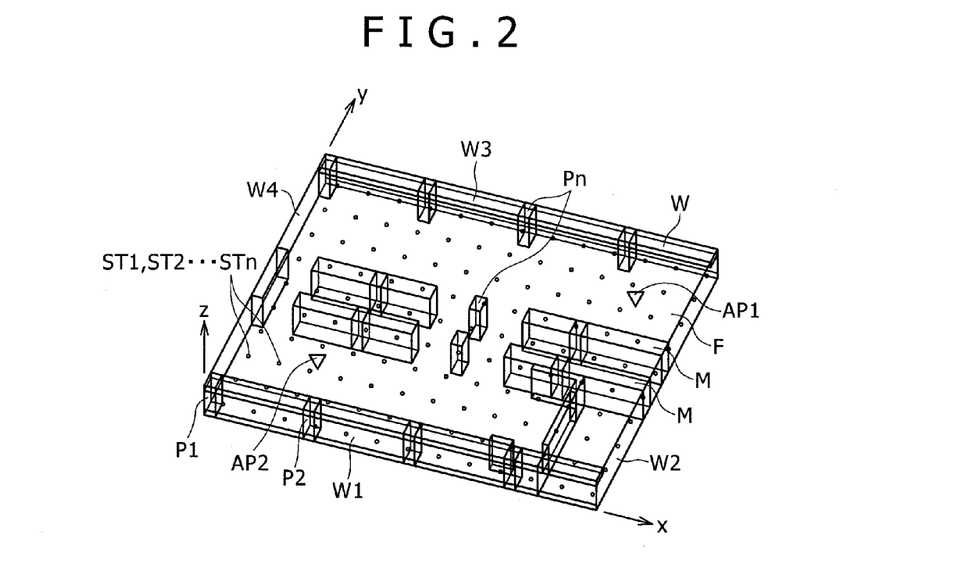
FIG. 2 is an example floor plan of a particular floor of a building.

FIG. 2 shows an example of three-dimensional structures in a typical building. The example of FIG. 2 shows the floor structure of a particular floor of a building. A wireless network is to be constructed in the floor structure of the particular floor. To construct a wireless network, coordinates are assigned to structures in the floor structure.

For example, this floor structure includes accessory structures, such as walls W1 to W4, a floor F, a ceiling (not shown), a window (not shown), and pillars P1 to Pn. The floor structure also includes accessory structures such as pieces of equipment M and furniture (not shown) installed in rooms partitioned by walls or partitions.

The layout positions of fundamental structures, such as the walls W, the window, and pillars P, forming the floor structure of the particular floor, in which a wireless network is to be constructed, and optionally the layout positions of the equipment M and furniture, antennas AP1, AP2, receiving stations ST1 to STn, or the like are represented by predefined, three-dimensional coordinate systems (x, y, z).

An x component represents a coordinate in the length direction of the floor; a y component a coordinate in the width direction thereof; and a z component a coordinate in the height direction thereof.

The coordinate positions of the structures, such as the walls W, the floor F, the ceiling, the window, the pillars P, the equipment M and furniture installed in the room, and the base station antennas AP and the receiving antennas ST, are predefined, for example, using the lower-left corner as the origin of the three-dimensional coordinate system (x, y, z).

Figure 3:
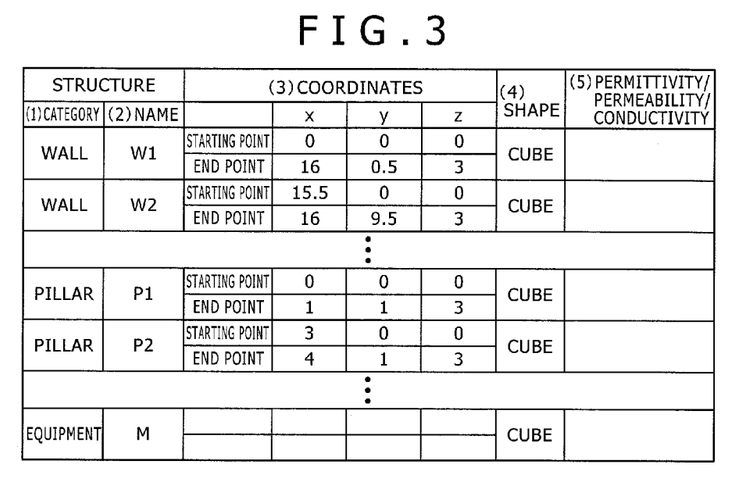
FIG. 3 is a diagram where attributes corresponding to structures on the particular floor of the building are described.

FIG. 3 shows an example of three-dimensional structure information where the structures and the like shown in FIG. 2 are represented by coordinates. The three-dimensional information includes, for example, (1) type of structure, (2) name of structure, (3) three-dimensional coordinate system (x, y, z), and (4) shape. These pieces of information are stored in the storage unit 103 of the wireless environment detection apparatus 100.

For the structures having a rectangular parallelepiped shape, such as the walls and pillars, three-dimensional structure information thereof is represented in such a manner that the coordinate positions of two diagonal points thereof are specified. For example, FIG. 3 shows that the wall W1 located in an lower portion of FIG. 2 is a rectangular parallelepiped-shaped structure having a starting point at coordinates (0 0 0) and an end point at coordinates (16 0.5 3) and thus having a length of 16 m, a thickness (width) of 0.5 m, and a height of 3 m. Similarly, the wall W2 in a right portion of FIG. 2, the wall W3 in an upper portion thereof, and the wall W4 in a left portion thereof are defined.

FIG. 3 also shows that the pillar P1 located at the origin of the floor structure is a rectangular parallelepiped-shaped structure having a starting point at coordinates (0 0 0) and an end point at coordinates (1 1 3) and thus having a length of 1 m, a thickness (width) of 1 m, and a height of 3 m.

Similarly, the pillar P2 adjacent to the pillar P1 is a rectangular parallelepiped-shaped structure having a starting point at coordinates (3 0 0) and an end point at coordinates (4 1 3) and thus having a length of 1 m, a thickness of 1 m, and a height of 3 m. Other pillars Pn are defined as well.

Similarly, the pieces of equipment M and furniture (not shown) are represented by three-dimensional coordinates and shapes.

While an example of three-dimensional information is shown in FIG. 3, (5) at least one of permittivity, permeability, and conductivity, which are electrical properties, is stored along with three-dimensional information for each of the structures. Unlike in a case where the target space is wide as in Patent Literature 1, these parameters are important in estimating radio signal propagation characteristics inside a building.

Specifically, when a structure is the wall W, permittivity, permeability, or conductivity, which is an electrical property of the material for the wall, is stored. Of course, when another structure is a pillar, an electrical property of the material for the pillar is stored as well.

AP1 and AP2 shown in FIG. 2 represent the layout positions of the base station antennas. A wireless network is constructed in the floor structure of the particular floor via radio waves emitted by the base station antennas AP1 and AP2.

Figure 4:
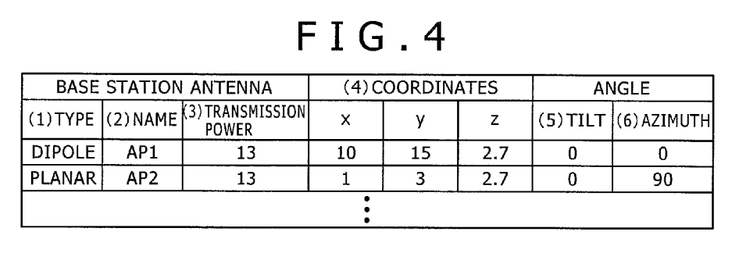
FIG. 4 is a diagram where attributes of wireless base stations on the particular floor of the building are described.

For example, as shown in FIG. 4, three-dimensional information of the base station antennas AP1 and AP2 includes the following information with respect to a dipole antenna, a planar antenna, or the like: (1) type of antenna, (2) name of antenna, (3) transmission power, (4) three-dimensional coordinate values (x, y, z), (5) tilt angle, and (6) azimuth angle.

For example, FIG. 4 shows that the base station antenna AP1 located in an upper right portion of FIG. 2 uses a dipole antenna, has transmission power of 13 dBm, and is installed with a tilt angle of 0° and an azimuth angle of 0° at a coordinate position (10 15 2.7).

Similarly, FIG. 4 shows that the base station antenna AP2 located in a lower left portion of FIG. 2 uses a planar antenna, has transmission power of 13 dBm, and is installed with a tilt angle of 0° and an azimuth angle of 90° at a coordinate position (1 3 2.7).

White circles shown in FIG. 2 represent the positions of receiving antennas ST and represents points at which the receiving antennas ST1 to STn receive power from the base station antennas AP1 and AP2 and measure the power.

Figure 5:
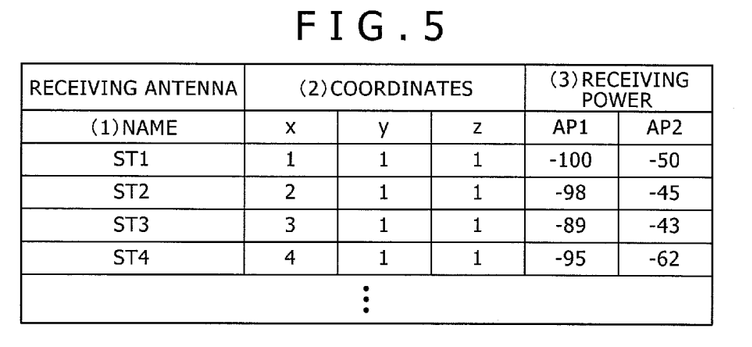
FIG. 5 is a diagram where attributes of receiving antennas on the particular floor of the building are described.

FIG. 5 shows an example of radio wave propagation characteristic values measured by the receiving antennas ST and specifically shows the following information with respect to each receiving antenna ST: (1) name, (2) three-dimensional coordinate value (x, y, z), and (3) values of power received from the base station antennas AP1 and AP2.

These pieces of information are stored in the storage unit 103 of the wireless environment detection apparatus 100, as described above.

Three-dimensional information of the accessory structures, the base station antennas AP, the receiving antennas ST, and the like as shown in FIGS. 3 to 5 is inputted using the input unit 101.

The input unit 101 may be an input unit with which an operator inputs information manually, such as a keyboard, an input unit configured to receive data transmitted from another medium (DVD, CD, flash memory, etc.), or an input unit configured to automatically obtain these pieces of information when coupled to another apparatus.

For example, the input unit 101 may be coupled to a computer aided design (CAD) apparatus to use a CAD drawing as three-dimensional information. Further, the input unit 101 may be used as an apparatus for inputting space information by coupling it to a laser range scanner, three-dimensional recognition camera, or the like.

The graph generation unit 102 has a function of generating graph information by defining pieces of space formed by three-dimensional structures as nodes and defining edges (links) for linking the defined nodes.

Figure 6:
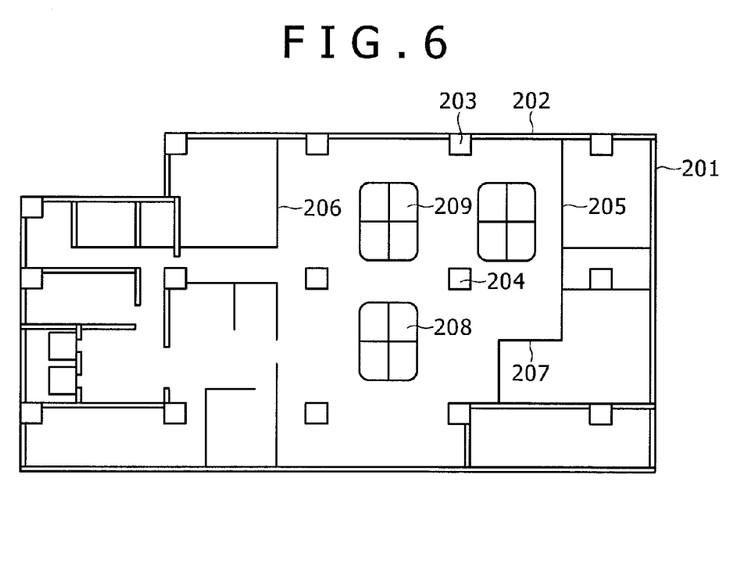
FIG. 6 shows an example floor plan of the particular floor of the building.

The function of the graph generation unit 102 will be described based on a floor plan of the building shown in FIG.

6. FIG. 6 shows a floor plan obtained by viewing three-dimensional structures received by the input unit 101 and stored in the storage unit 103 from above. Although these three-dimensional structures are shown two-dimensionally, they correspond to three-dimensional structures. (Note that this embodiment is not limited to three-dimensional data, and the effectiveness of the present invention does not change even when the data is two-dimensional data.

In FIG. 6, reference numerals 201, 202 represent walls; a pillar 203 is disposed along the walls 201, 202; and a pillar 204 which is different from the pillar 203 is disposed on the floor. While many walls and pillars other than the walls 201, 202 and the pillars 203, 204 are disposed, reference numerals thereof are omitted in the drawing. These walls and pillars are typified by the walls 201, 202 and the pillars 203, 204.

Partitions 205, 206, 207 for partitioning the room are disposed on the floor. Pieces of furniture, desks 208, 209, are disposed in the partitioned room. While many partitions and furniture pieces other than those described above are disposed, reference numerals thereof are omitted in the drawing.

The graph generation unit 102 extracts, from the floor plan, pieces of space which do not block radio waves or pieces of space which transmit radio waves while blocking them less effectively. The expression "do not block radio waves" means that there is no structure. Note that an object having a size of about 2 to 5 times the wavelength of the target radio frequency is negligible.

Figure 7:
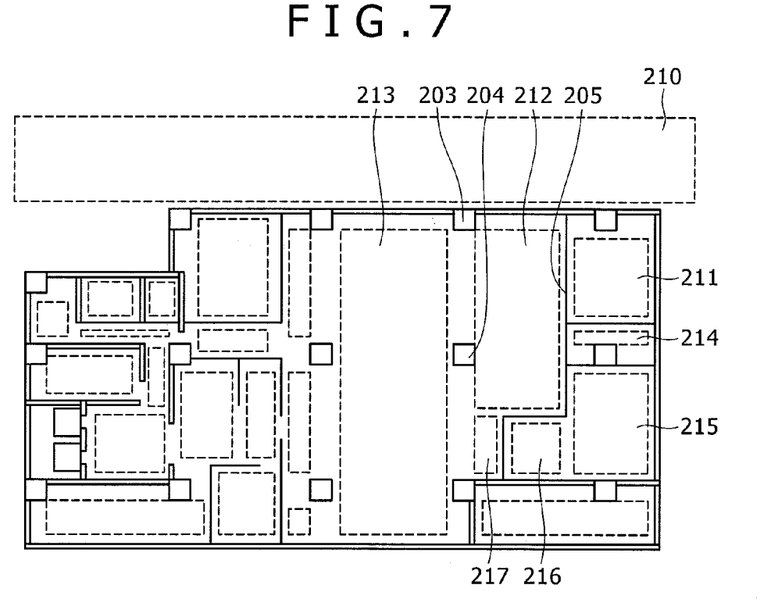
FIG. 7 is a floor plan showing the existence state of nodes in the floor plan shown in FIG. 6.

FIG. 7 shows an example of pieces of space that do not block radio waves or pieces of space that transmit radio waves while blocking them less effectively, obtained by the graph generation unit 102.

In FIG. 7, the above-mentioned pieces of space are represented by regions enclosed by dotted lines and typified by pieces of space having reference numerals 210 to 217. Methods for extracting these pieces of space include voxel division, by which space is divided uniformly and finely, a method of dividing space while noting the boundaries among sides forming a structure, and k-d tree division. Use of these methods allows features of space to be identified. Reference numeral 210 represents space outside the building.

Figure 8:
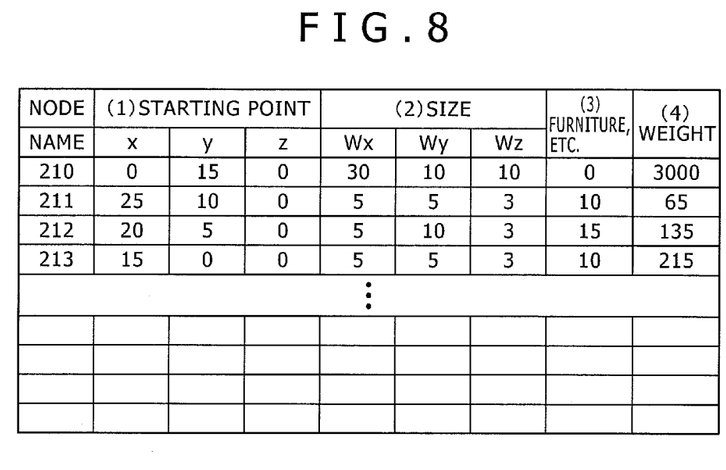
FIG. 8 is a diagram where attributes of the nodes shown in FIG. 6 are described.

The graph generation unit 102 defines these pieces of space as nodes. Attributes of the nodes are shown in FIG. 8. FIG. 8 shows (1) three-dimensional space coordinate values (m) of starting point and (2) lengths (m) in axis directions (three-dimensional directions) of space corresponding to each node.

A value represented by (3) furniture, etc. represents the volume of furniture or the like contained in space corresponding to each node; (4) weight refers to, for example, a value obtained by subtracting the volume of furniture or the like from the volume of space corresponding to each node and represents the ease of propagation of radio waves through the space. The weight, that is, the ease of propagation of radio waves also varies according to such as the material for the furniture. Depending on the material, a modification to the weight is considered.

The graph generation unit 102 also has a function of calculating an edge (link) for linking nodes. Specifically, it identifies a structure present between nodes with respect to each of boundary surface directions of each node and calculates and generates an edge (link) with respect to nodes interposing the identified structure. Such an edge (link) is calculated using attributes of the structures described in FIG. 3 and the like.

Note that all the attributes shown in FIG. 3 need not necessarily be used in this calculation, in other words, any attributes may be used as long as an edge (link) is obtained appropriately.

If part of a boundary surface between nodes is covered by a structure, the area of the remaining part of the boundary surface, which is not covered by the structure, is regarded as the area of an opening. An edge (link) is generated with respect to the nodes interposing the opening so as to link the nodes.

For example, note a node 212 of FIG. 7. Edges (links) can be established between the node 212 and a node 211, between the node 212 and a node 213, between the node 212 and a node 214, between the node 212 and a node 215, between the node 212 and a node 216, and between the node 212 and a node 217.

Figure 9:
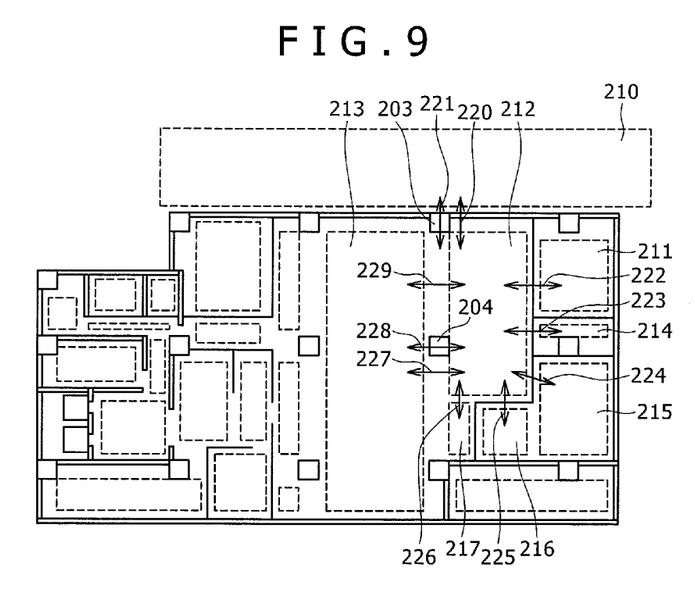
FIG. 9 is a floor plan showing the existence state of edges (links) linking the nodes shown in FIG. 6.

Specifically, in FIGS. 7 and 9, the upper boundary surface of node 212 is adjacent to a node 210 with a portion of the wall 202 therebetween and adjacent to the node 210 with a portion of the pillar 203 therebetween. Accordingly, edges (links) 220 and 221 are generated between the nodes 212 and 210.

Similarly, the right boundary surface of node 212 is adjacent to nodes 211, 214, and 215 with the partition 205 therebetween. Accordingly, edges (links) 222, 223, and 224 are generated between the nodes 212 and 211, between the nodes 212 and 214, and between the nodes 212 and 215, respectively.

Further, since the partition 207 is present between the lower boundary surface of the node 212 and a node 216, an edge (link) 225 is generated between the nodes 212 and 216.

On the other hand, the lower boundary surface of node 212 is linked to node 217 without the entire lower boundary surface being covered by the area of the partition 207. Accordingly, an edge (link) 226 is generated between the nodes 212 and 217 as an opening directly adjacent to the node 212. If a window, for example, is disposed on the wall 202 or if a door, for example, is disposed on the partition 206, an edge (link) is also generated with respect to this portion.

Similarly, edges (links) 227 to 229 are generated between the nodes 212 and 213.

Figure 10:
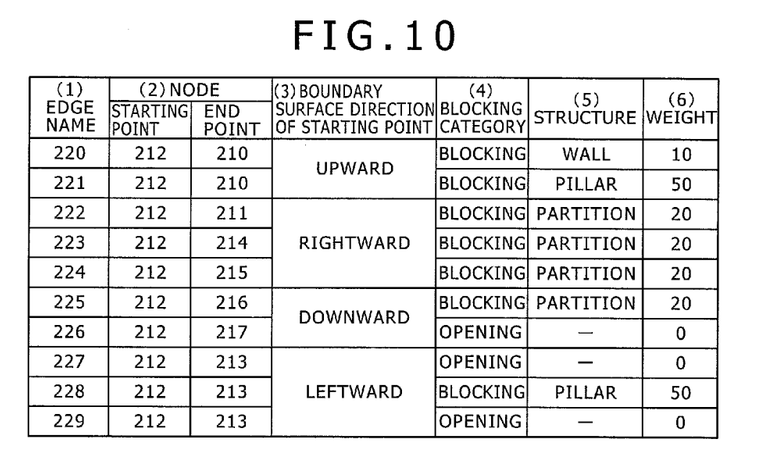
FIG. 10 is a diagram where attributes of the edges (links) shown in FIG. 9 are described.

FIG. 10 shows descriptions of the edges shown in FIG. 9. In FIG. 10, the following items are defined for each edge: (1) name, (2) starting point node and endpoint node, (3) boundary surface direction of starting point, (4) blocking category, (5) category of blocking structure, (6) weight of edge, and the like.

Figure 11:
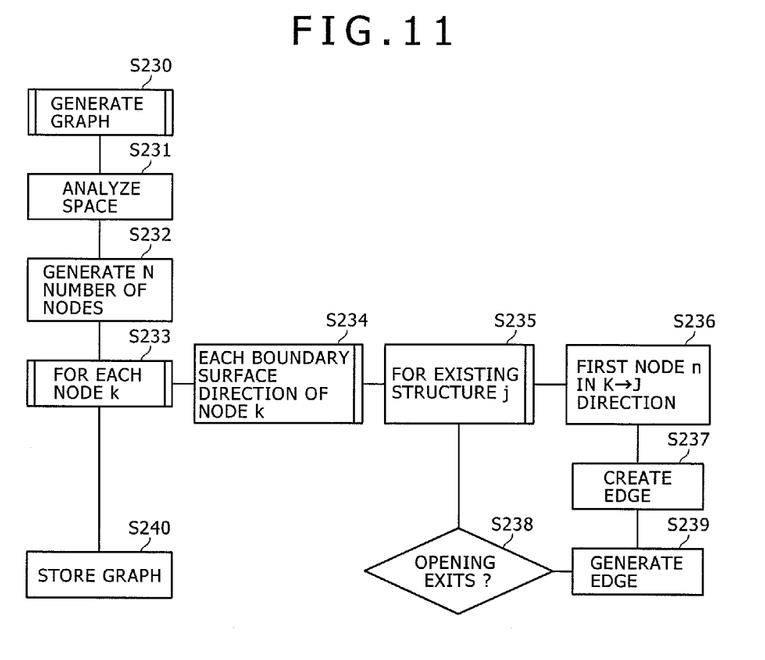
FIG. 11 is a flowchart showing a method for generating a graph for obtaining nodes and edges (links) on the particular floor of the building.

Next, a process for generating such edges (links) will be described based on a flowchart shown in FIG. 11. In step S230 of FIG. 11, in order to generate a graph, a floor plan as shown in FIG. 6 is read from the storage unit 103 and loaded into the graph generation unit 102.

Next, the process proceeds to step S231 to perform a space analysis process. In this step, pieces of space which do not block radio waves or pieces of space which transmit radio waves while blocking them less effectively are extracted from the floor plan read as described above.

After extracting the pieces of space, the process proceeds to step S232 to generate nodes corresponding to the extracted pieces of spaces. After generating the nodes, the process proceeds to step S233 to define attributes of the nodes. As shown in FIG. 8, these attributes include the position of each node, the sizes of each node, presence of furniture, and the weight of each node.

Next, in steps S232 and S233, a node k is generated, and attributes thereof are determined. The process proceeds to step S234 to determine the boundary surface directions of the node k serving as a reference. The process then proceeds to step S235 to analyze the existing structures using attributes as described in FIG. 3.

Based on the analysis result, in step S236, a node present in the direction of a structure j with respect to the node serving as a reference is determined. In step S237, an edge (link) is generated.

If it is determined in step S238 that an opening such as a window or door is present in any boundary surface direction, an edge (link) is generated between nodes passing through this opening, in step S239.

In this way, the definition of edges (link) as shown in FIG. 10 is completed. The process then proceeds to step S240 to perform a graph storage process.

Figure 12:
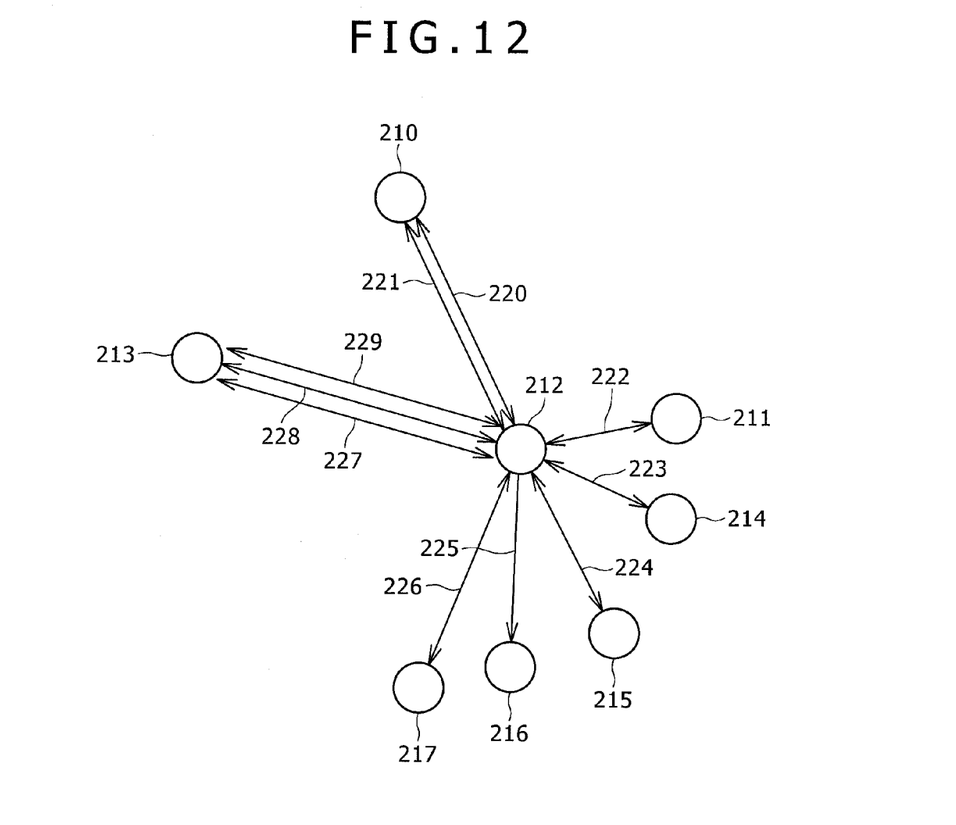
FIG. 12 is a diagram showing an example topology representing the relationships between the nodes and edges (links) obtained from the flowchart shown in FIG. 11.

FIG. 12 shows a topology where the relationships between these nodes and edges (links) are shown as a graph. In the case of a three-dimensional structure, each node has one or more edges (links) with respect to a boundary surface thereof in each direction and has information as to whether radio waves are blocked between nodes.

As seen above, when three-dimensional (or two-dimensional) structures as shown in FIG. 6 are provided, the graph generation unit 102 performs space analysis to generate a graph.

If the building is a building in which a wireless network is already constructed, the graph generation unit 102 stores the generated graph as a database in the storage unit 103 along with data indicating the layout of base station antennas in the building as shown in FIG. 4 and the propagation environment measured values of the receiving antennas shown in FIG. 5. These are used as graphs known to the graph detection unit 104 to be discussed later.

These databases are updated and accumulated each time a wireless network is constructed. Accordingly, more accurate data is accumulated as the database is expanded, and the degree of correlation can be increased in graph detection to be discussed later.

Figure 13:
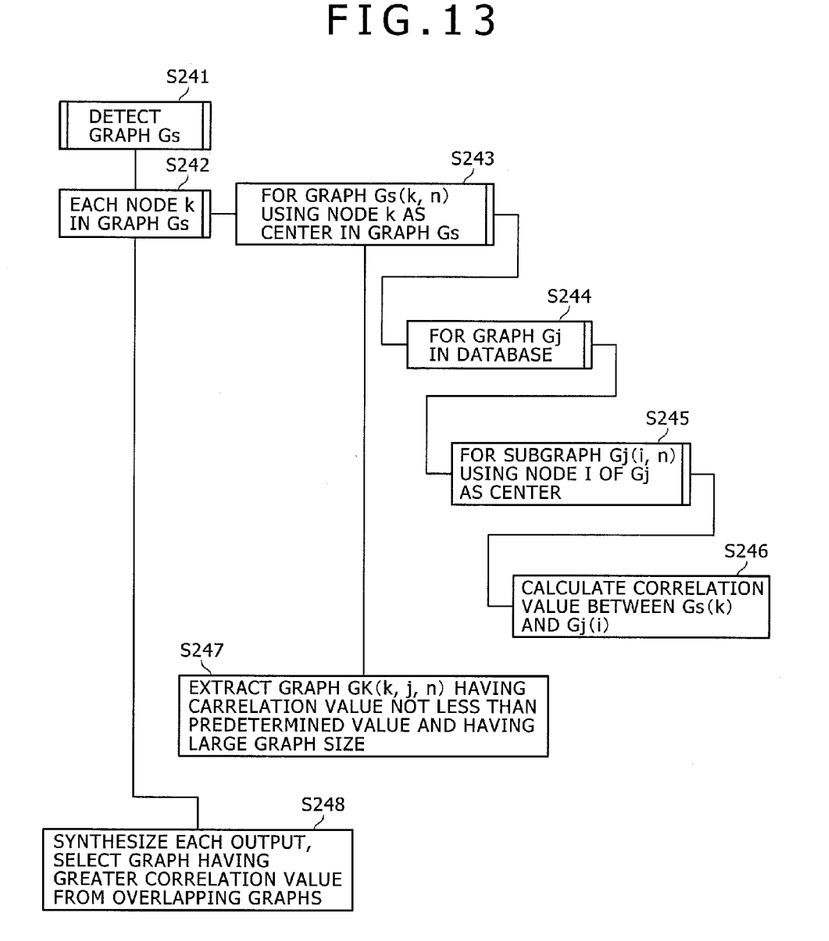
FIG. 13 is a flowchart showing a method for obtaining the correlation between new and existing buildings and extracting a graph of an existing building having a high degree of correlation.

FIG. 13 is an example of a flowchart showing a process performed by the graph detection unit 104.

In the construction of a new wireless network, the graph detection unit 104 detects a graph Gs representing a new building. In this case, an edge (link) corresponding to each node is generated in a process as shown in FIG. 11.

In step S242, the graph detection unit 104 performs a process described below with respect to each node k in the graph Gs.

Specifically, in step S243, the graph detection unit 104 performs a process of extracting a subgraph Gs (k, n) in which up to n number of edges (links) are allowed, with respect to each node k. The subgraph Gs (k, n) is a subgraph of the graph Gs and includes nodes from a node k serving as a center to nodes which are distant from the node k by n number of edges (links).

Such a subgraph represents relationships as shown in FIG. 12. The number n may be a predetermined value, or the process may be performed repeatedly with respect to numbers from one to the maximum number, N.

Step S244 shows that a process similar to that shown in step S243 is performed with respect to each graph Gj in the existing database.

In step S245, the graph detection unit 104 performs a process of, with respect to each node i included in a graph Gj in the database, extracting a subgraph Gj (i, n) having the node as a center. In this process, a subgraph Gj (i,n) similar to the subgraph Gs (k,n) obtained in step 243 is extracted.

Accordingly, a more similar subgraph G (i, n) is obtained as the database becomes more sufficient. In this case, a single subgraph Gj (i, n) may be extracted from the database, or in some cases, multiple subgraphs Gj (i, n) may be extracted.

After obtaining the subgraph Gs (k, n) of the new building and the similar subgraph Gj (i, n) in the database through the above-mentioned process, the graph detection unit 104 performs a process of calculating a correlation value between both graphs, in step S246. A correlation value between both graphs is obtained, for example, by vectorizing the weights of nodes, the weights of edges (links) coupled at equal distances, or the like and calculating the inner product of the vectors. Note that the method for determining a correlation value is not limited to the above-mentioned one, and a method suitable to the building is selected and used.

After obtaining a correlation value by performing the process of calculating a correlation value between both graphs, the graph detection unit 104, in step S247, extracts a subgraph Gk (k, j, n) having a correlation value not smaller than a predetermined value, for example, a subgraph Gk (k, j, n) having the greatest correlation value from the database, with respect to each node of the graph Gs of the new building.

After extracting, for example, a subgraph G (k, j, n) having the greatest correlation value from the database, the graph detection unit 104, in step S248, performs a process of synthesizing a subgraph Gk (k, j, n) corresponding to each node k of the graph Gs of the new building. One of advantageous methods is a method of disposing a subgraph Gk (k, j, n) having a node k as a center and, when there are overlapping nodes, selecting a node and edge (link) included in a subgraph G (k, j, n) having a higher correlation value.

By performing the above-mentioned process, the graph detection unit 104 can extract a subgraph having a higher correlation value from among subgraphs contained in the existing database.

Figure 14:
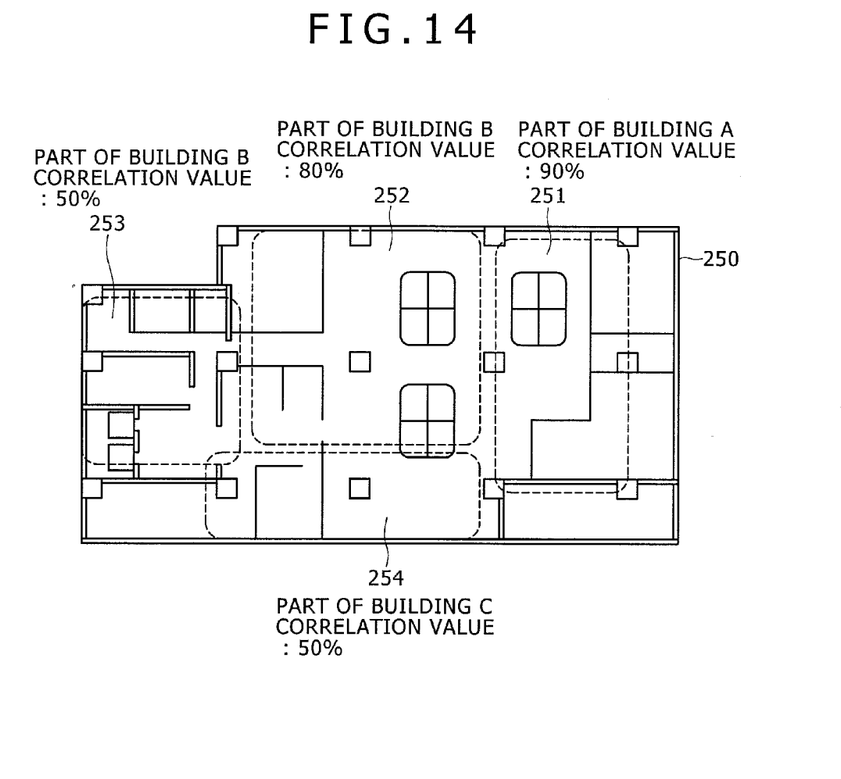
FIG. 14 is a diagram showing an example where graphs having a high degree of correlation obtained in FIG. 13 are laid out and displayed on the floor plan of the new building.

FIG. 14 is a diagram showing an example where the subgraphs having a higher correlation value are displayed on the display unit 105 in a combined manner. Reference numeral 250 represents a floor plan of a building in which base stations are desired to install newly. The ranges of structure data (for example, three-dimensional structure data) composed of the subgraphs having a higher correlation value extracted from the database and respective correlation values are overlaid on this floor plan.

Reference numeral 251 represents a subgraph corresponding to part of a building A stored in the database, and the correlation value of the subgraph is 900.

Reference numeral 252 represents a subgraph corresponding to part of a building B stored in the database, and the correlation value of the subgraph is 80%; reference numeral 253 represents a subgraph corresponding to part of the building B stored in the database, and the correlation value of the subgraph is 50%; and reference numeral 254 represents a subgraph corresponding to part of a building C stored in the database, and the correlation value of the subgraph is 50%.

A wireless network is constructed while regarding base stations installed in the subgraphs as base stations to be installed in the new building.

Figure 15:
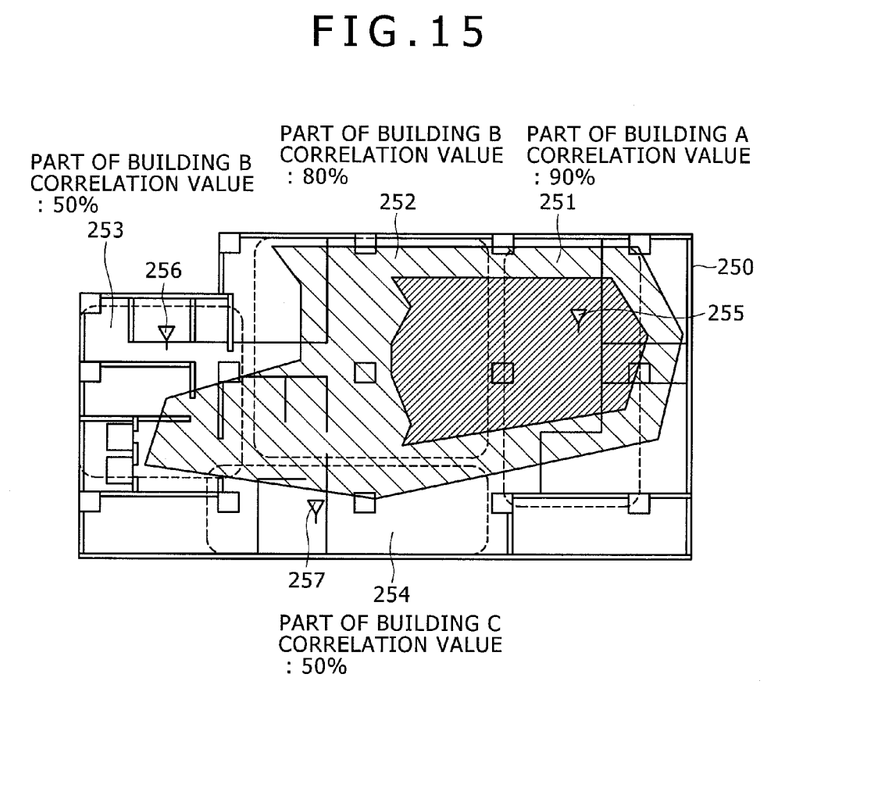
FIG. 15 is a diagram showing an example where the graphs having a high degree of correlation obtained in FIG. 13 are laid out on the floor plan of the new building to display wireless base stations.

This is shown in FIG. 15. FIG. 15 is an example where a base station antenna 255 of the building A, a base station antenna 256 of the building B, and a base station antenna 257 of the building C are shown. In FIG. 15, a sparsely hatched region and a densely hatched region show degrees of correlation visually, and the densely hatched region represents a higher degree of correlation. Alternatively, degrees of correlation may be shown by hatching the regions with different colors.

As seen, according to the first embodiment of the present invention, in the construction of a wireless network system in a building, a condition similar to structure conditions of the building in which it a wireless network system is desired to newly install is retrieved from among the structure conditions of buildings in which a wireless network system was installed in the past. As a result, a layout of base stations in a new building can be easily obtained using past base station layout information.

While the single apparatus has been described in this embodiment, the above-mentioned process may be performed by constructing a database in a data center to accumulate data from many vendors and connecting with the database using a network. In this case, many pieces of data are accumulated, allowing a subgraph having higher similarity to be obtained.

Second Embodiment

Figure 16:
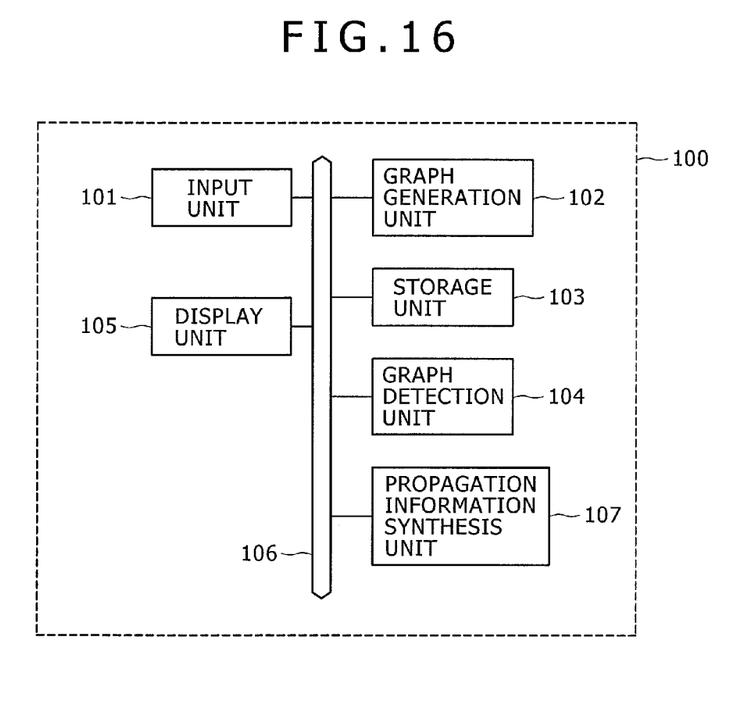
FIG. 16 is a diagram showing the configuration of an apparatus for supporting layout of wireless base stations according to another embodiment of the present invention.

FIG. 16 is characterized in that the wireless environment detection apparatus 100 includes a propagation information synthesis unit 107 in addition to the components of the first embodiment shown in FIG. 1. The propagation information synthesis unit 107 performs the following process in the registration of a graph related to an existing building and a propagation environment measured value in the database.

The propagation information synthesis unit 107 obtains a subgraph having a high correlation value and a propagation environment measured value from among graphs which are already registered in the database.

Next, the propagation information synthesis unit 107 compares the subgraph having a high correlation value with a subgraph of the existing building with respect to each node and edge (link). It then extracts nodes or edges (links) which are different by a predetermined value or more.

The propagation information synthesis unit 107 then compares the propagation environment measured value obtained from the database with a propagation environment measured value to be registered this time. If the difference is not greater than a predetermined value, the propagation information synthesis unit 107 combines the subgraphs together. Nodes or edges (links) extracted as portions corresponding to the difference are registered as a less effective error factor in the database.

In contrast, if the difference between the respective propagation environment measured values is not less than the predetermined value, the different is registered as an effective error factor in the database.

By performing the above-mentioned process, robustness against such as an error factor of the database can be increased.

LIST OF REFERENCE SIGNS 1 wireless environment detection apparatus
101 input unit
102 graph generation unit
103 storage unit
104 graph detection unit
105 display unit
107 propagation information synthesis unit

The invention claimed is:

1. An apparatus that includes a processor and memory, the processor configured to carry out a method of supporting layout of wireless base stations in a building, the method comprising:

storing at least a floor plan of an existing building, an attribute of a structure of the existing building, and a layout position of a wireless base station in the existing building;

generating a graph related to the exiting building and storing said graph related to the existing building;

defining, based on a floor plan of a new building or an attribute of a structure of the new building, part of space included in the new building as a node, defining, as an edge (link), a propagation path which is located between the node and another node adjacent to the node and through which a radio wave propagates, and generating a graph related to the new building by adding information indicating a link between the node and the edge (link);

evaluating correlation between a subgraph serving as part of said graph related to the new building and a subgraph serving as part of said stored graph related to the existing building, and extracting an existing subgraph having a high degree of correlation; and displaying the floor plan of the new building and extracting the layout position of the wireless base station from the extracted subgraph of the existing building and displaying the layout position.

2. The apparatus according to claim 1,
wherein the method further comprises storing the floor plan of the new building, the node, the edge (link), and the information indicating the link between the node and the edge (link).

3. The apparatus according to claim 2,
wherein the method further comprises:

extracting a plurality of subgraphs related to the respective floor plans of the new building and the existing building; and displaying the floor plan of the new building, extracting layout positions of a plurality of wireless base stations from the plurality of subgraphs of the existing building, and displaying the layout positions on the floor plan.

4. The apparatus according to claim 2,
wherein the method further comprises storing with an attribute of a structure of a building an electrical property of the structure, the electrical property being at least one of permittivity, permeability, and conductivity.

5. The apparatus according to claim 1,
wherein the displaying of the layout position represents a degree of correlation using one of color depth and color type.

6. The apparatus according to claim 1, wherein the method further comprises extracting, while newly registering the graph related to the new building, a difference between said graph to be newly registered and all or part of an already registered graph and, if a difference of the layout of the wireless base station is smaller than a predetermined value, registering the difference as a difference acting as a small error factor and, if the difference is greater than the predetermined value, registering the difference as a difference acting as a large error factor.

* * * * *